(12) United States Patent
Singh et al.

(10) Patent No.: US 9,711,346 B2
(45) Date of Patent: Jul. 18, 2017

(54) METHOD TO FABRICATE A HIGH PERFORMANCE CAPACITOR IN A BACK END OF LINE (BEOL)

(71) Applicant: GLOBALFOUNDRIES Inc., Grand Cayman (KY)

(72) Inventors: Sunil Kumar Singh, Mechanicville, NY (US); Shesh Mani Pandey, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/807,289

(22) Filed: Jul. 23, 2015

(65) Prior Publication Data

US 2017/0025270 A1    Jan. 26, 2017

(51) Int. Cl.
| | |
|---|---|
| *H01L 21/20* | (2006.01) |
| *H01L 21/02* | (2006.01) |
| *H01L 21/3065* | (2006.01) |
| *H01L 21/308* | (2006.01) |
| *H01L 21/3105* | (2006.01) |
| *H01L 21/283* | (2006.01) |
| *H01L 49/02* | (2006.01) |
| *H01L 27/08* | (2006.01) |

(52) U.S. Cl.
CPC ...... *H01L 21/02186* (2013.01); *H01L 21/283* (2013.01); *H01L 21/3065* (2013.01); *H01L 21/3081* (2013.01); *H01L 21/31051* (2013.01); *H01L 27/0805* (2013.01); *H01L 28/40* (2013.01)

(58) Field of Classification Search
CPC ......... H01L 2924/0002; H01L 2924/00; H01L 23/5226; H01L 23/528; H01L 23/53295; H01L 21/7681; H01L 21/76877; H01L 23/53238; H01L 21/76811; H01L 21/76834; H01L 21/76885; H01L 23/5329; H01L 21/768
See application file for complete search history.

(56) References Cited

U.S. PATENT DOCUMENTS

| | | | |
|---|---|---|---|
| 6,777,809 B2 | 8/2004 | Duncombe et al. | |
| 7,091,542 B1 | 8/2006 | Yang et al. | |
| 7,160,772 B2 | 1/2007 | Coolbaugh et al. | |
| 2009/0190778 A1* | 7/2009 | Delia | H03G 3/3005 381/104 |
| 2010/0314763 A1* | 12/2010 | Sohn | H01L 21/3105 257/741 |
| 2014/0284759 A1* | 9/2014 | Fuse | H01L 29/66734 257/506 |

\* cited by examiner

*Primary Examiner* — Robert Bachner
(74) *Attorney, Agent, or Firm* — Heslin Rothenberger Farley & Mesiti P.C.; Nathan B. Davis

(57) ABSTRACT

A method can include applying a patterned mask over a semiconductor structure, the semiconductor structure having a dielectric layer, forming using the patterned mask a material formation trench intermediate first and second spaced apart metal formations formed in the dielectric layer, and disposing a dielectric material formation in the material formation trench.

12 Claims, 8 Drawing Sheets

US 9,711,346 B2

METHOD TO FABRICATE A HIGH PERFORMANCE CAPACITOR IN A BACK END OF LINE (BEOL)

TECHNICAL FIELD

The present disclosure relates to a semiconductor structure and more particularly a method for formation of a capacitor in a fabrication process flow.

BACKGROUND OF THE INVENTION

The capacitor is a critical element in radiofrequency and microwave circuits for high frequency wireless applications.

A metal-insulator-metal (MIM) capacitor is commonly used in high performance applications in CMOS technology. Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from Al or AlCu alloys that can be patterned and etched through the use of several photolithography photomasking steps. The thin insulating dielectric layer is typically made from silicon oxide or silicon nitride deposited by chemical vapor deposition (CVD).

Vertical natural capacitors (VNCAP) with stacked via-comb structures have emerged as an attractive option due to their low cost, high density, and highly symmetric configurations.

BRIEF DESCRIPTION

A method can include applying a patterned mask over a semiconductor structure, the semiconductor structure having a dielectric layer, forming using the patterned mask a material formation trench intermediate first and second spaced apart metal formations formed in the dielectric layer, and disposing a dielectric material formation in the material formation trench.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
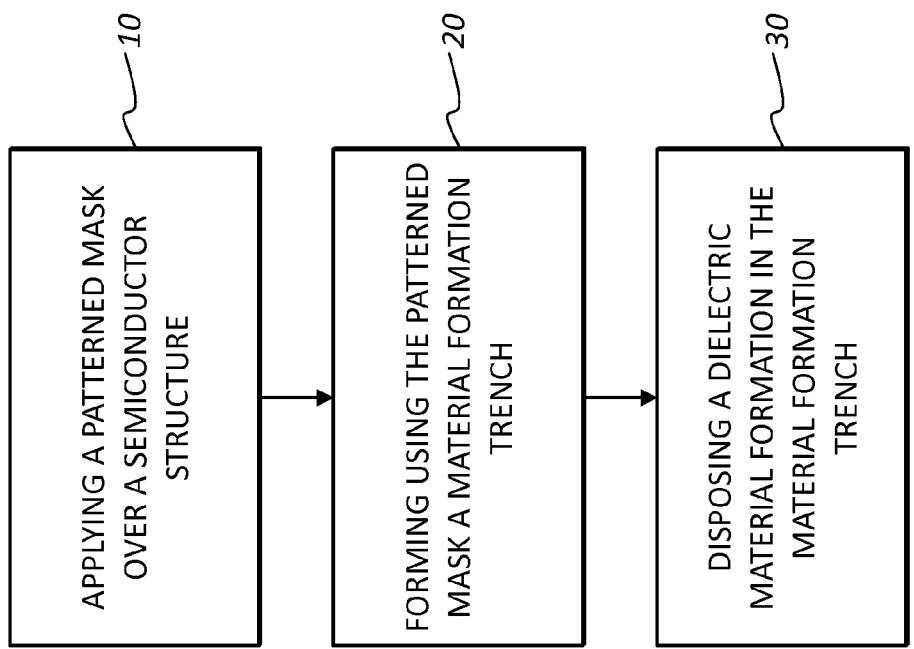
FIG. 1 is flow diagram illustrating a method for use in formation of a capacitor.

Referring to the flow diagram of FIG. 1 a method can include applying at block 10 a patterned mask over a semiconductor structure. A method can further include at block 20 forming using the patterned mask a material formation trench. A method can further include at block 30 disposing a dielectric material formation in the material formation trench.

In one embodiment, the semiconductor structure can include a dielectric layer. The forming at block 20 in one embodiment can include forming the material formation trench in the dielectric layer intermediate first and second spaced apart metal formations formed in the dielectric layer.

Figure 2:
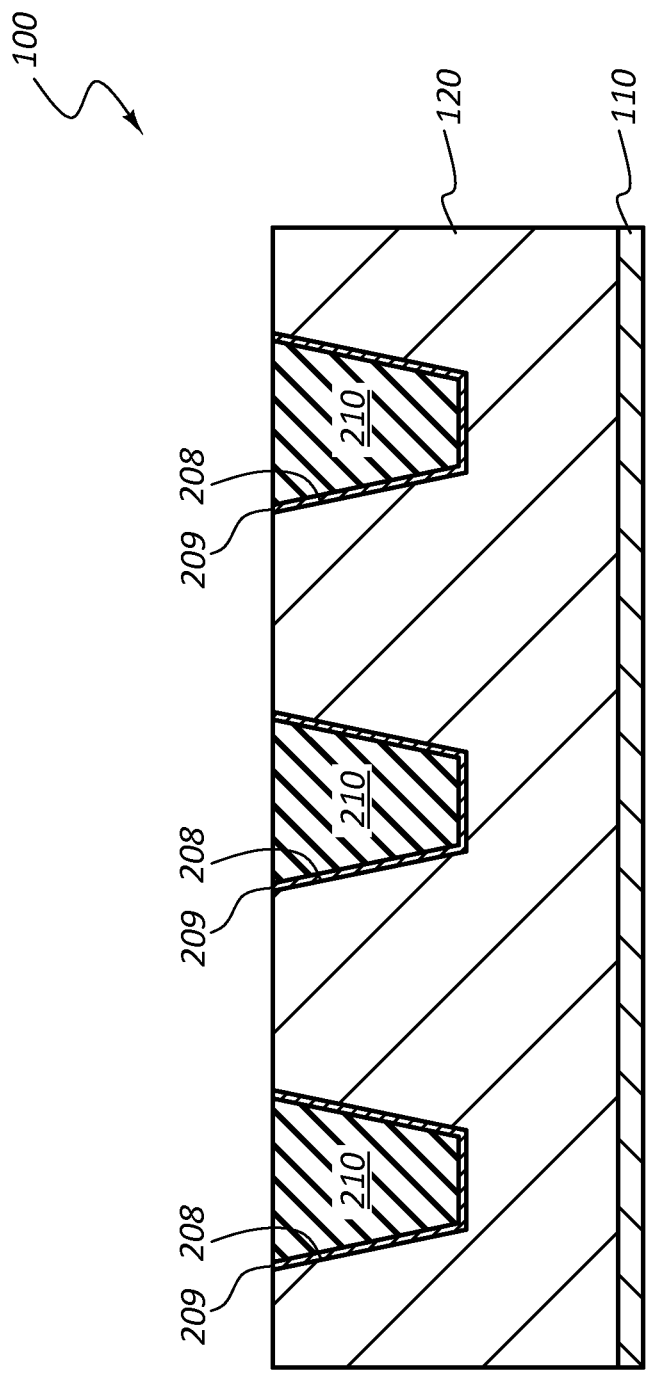
FIG. 2 is a cross sectional side view of a semiconductor structure in an intermediate stage of fabrication after formation of metal formations.

A semiconductor structure 100 in an intermediary stage of fabrication is shown in FIG. 2. Semiconductor structure 100 can include a layer 120 which can be a dielectric layer. Formed in layer 120 can be metal formations 210. Metal formations 210 which can be defined by a layer can be formed in metal formation trenches 208 of layer 120. Also formed in metal formation trenches 208 can be liners 209. Layer 120 can be formed of oxide in one embodiment.

Figure 3:
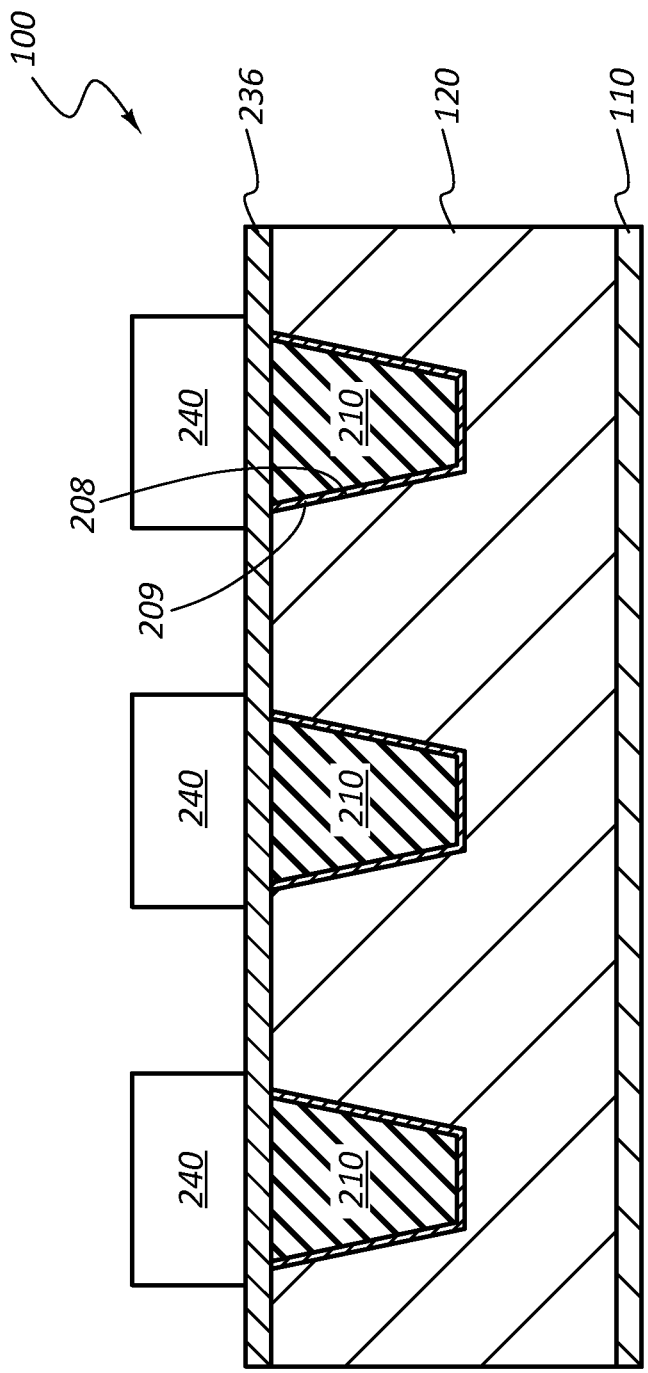
FIG. 3 is a cross sectional side view of a semiconductor structure in an intermediate stage of fabrication after application of a mask.

FIG. 3 illustrates semiconductor structure 100 after application of layer 240 which can be a mask layer. FIG. 3 illustrates performance of block 10 in one embodiment. Layer 240 can be a photoresist mask in one embodiment. In addition to having layer 240 semiconductor structure 100 as shown in FIG. 3 can include a layer 236 formed over layer 120. Layer 236 can be formed on layer 120 in one embodiment. Layer 236 can be a dielectric layer formed of nitride in one embodiment.

Figure 4:
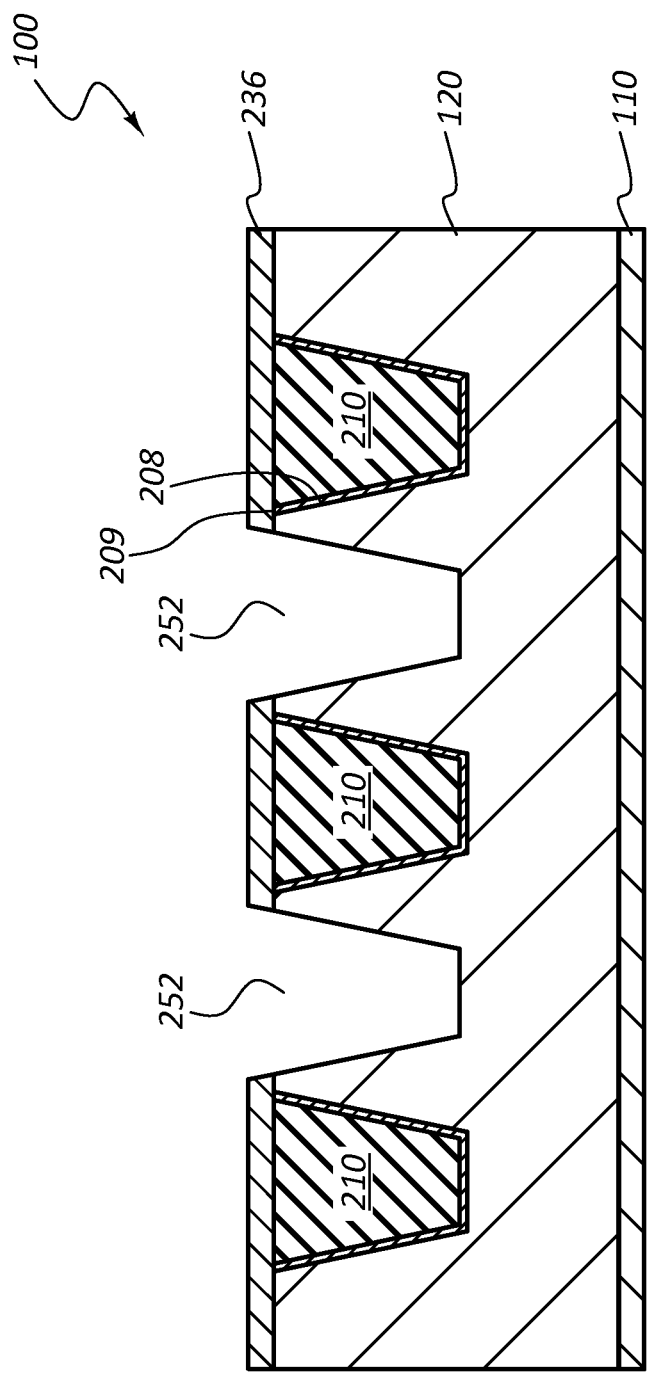
FIG. 4 is a cross sectional side view of a semiconductor structure in an intermediate stage of fabrication after formation of a material formation trench.

FIG. 4 illustrates the semiconductor structure 100 as shown in FIG. 3 after formation of material formation trenches 252 in layer 120. FIG. 4 illustrates performance of block 20 in one embodiment. Material formation trenches 252 can be formed using layer 240 which can be a mask layer. A dry etching process, e.g., plasma etching can be used for the formation of trenches 252. A profile of trenches 252 can be well controlled using plasma etching.

Figure 5:
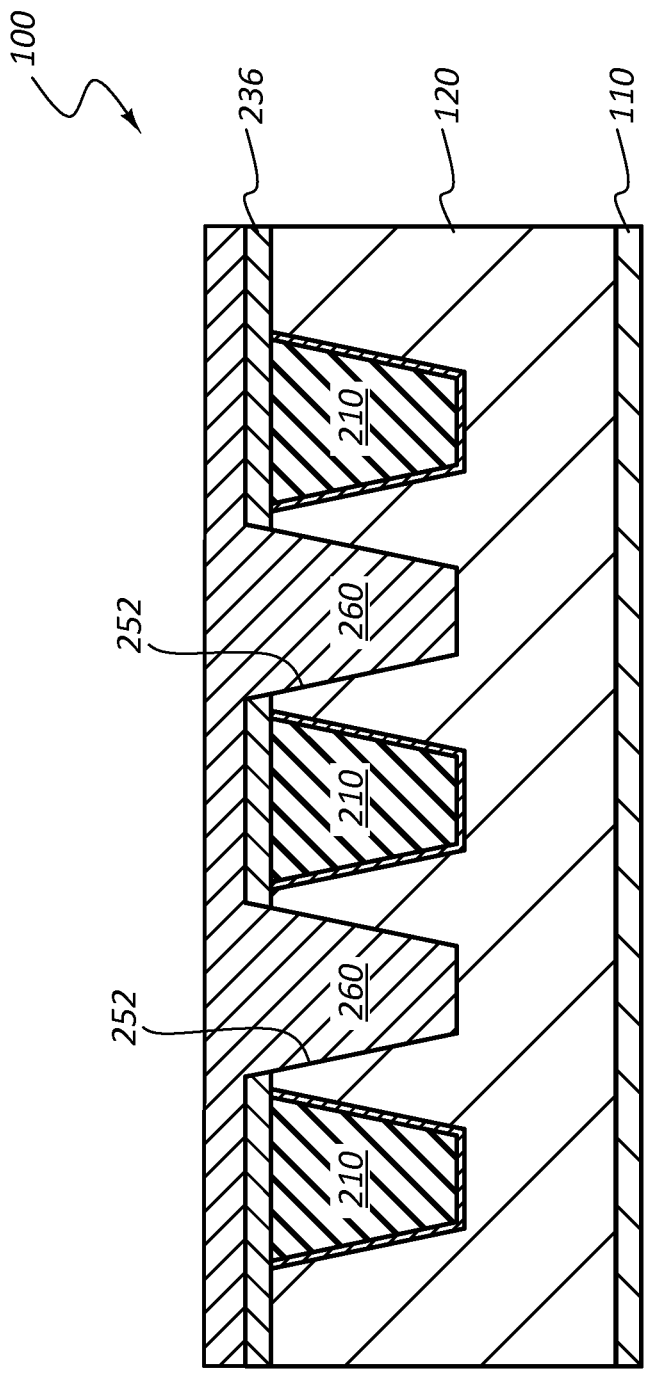
FIG. 5 is a cross sectional side view semiconductor structure in an intermediate stage of fabricate on after formation of a dielectric layer in a material formation trench.

FIG. 5 illustrates the semiconductor structure 100 as shown in FIG. 4 after formation of layer 260 in trenches 252. Layer 260 can be formed of barium titanate in one embodiment, BaTiO3, or other high K dielectric. A dielectric constant of layer 260 can be about 2000 in one embodiment where layer 260 is formed of BaTiO3.

Figure 6:
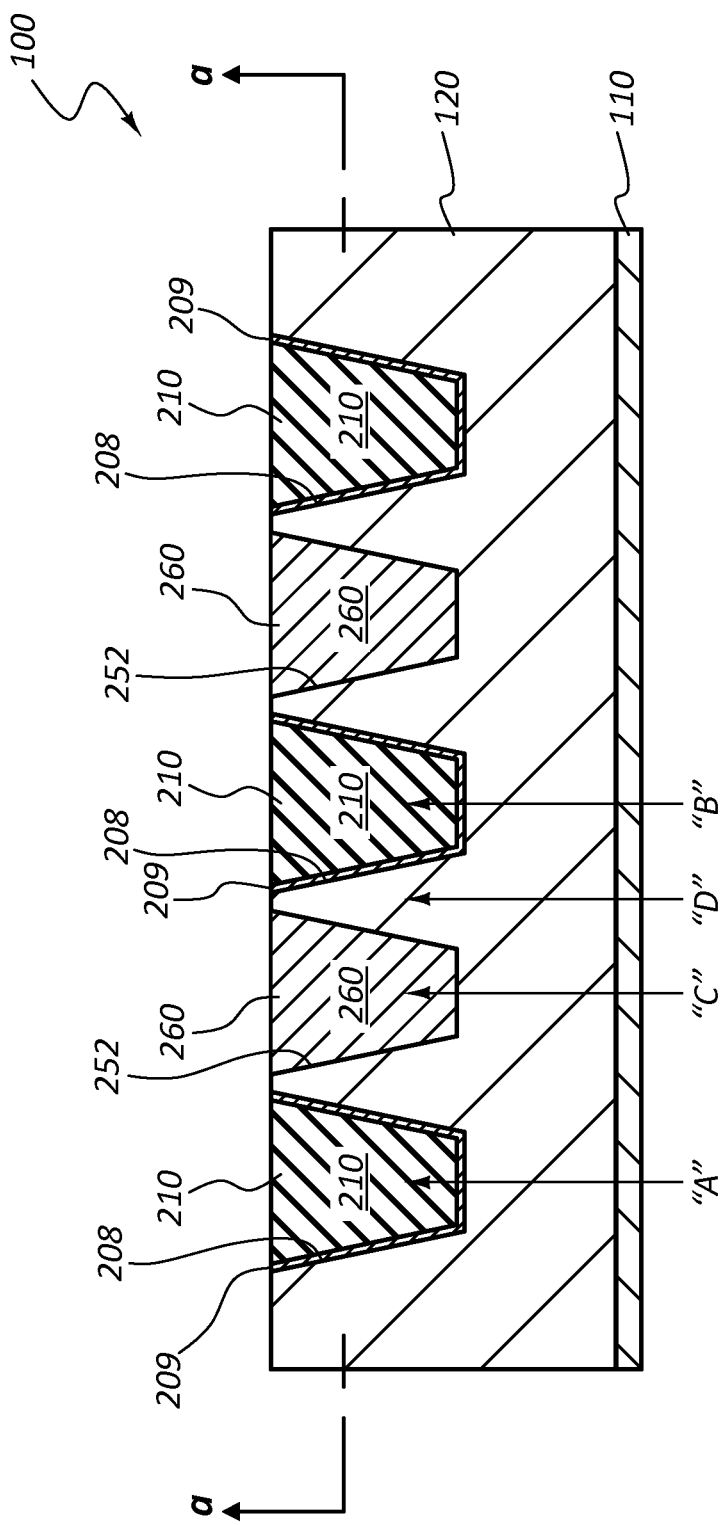
FIG. 6 is a cross sectional side view of a semiconductor structure in an intermediate stage of fabrication after planarization of the semiconductor structure.

FIG. 6 illustrates the semiconductor structure as shown in FIG. 5 after planarization. Semiconductor structure 100 can be planaraized to remove material of layer 209, the layer defining formation 210 (which formation can be regarded as a layer) and layer 260. On completion of planarization according to the stage depicted in FIG. 6, layer 209, layer 210, and layer 260 can have a common top elevation. Chemical mechanical planarization (CMP) can be used for performance of CMP as is depicted in FIG. 6. FIG. 5 and FIG. 6 illustrate performance of block 30 in one embodiment. FIGS. 5 and 6 illustrate disposing a dielectric material formation in a material formation trench.

Referring to the semiconductor structure 100 of FIG. 6, there can be a horizontal cross section taken along line a-a extending through a first metal formation 210 at location "A" and a second metal formation 210 at location "B". The horizontal cross section taken along line a-a can extend through first and second dielectric material formations (location "C" and "D"), one of the first or second dielectric material formations being formed of barium titanate (e.g., the formation at location "C"), and one of the first or second dielectric material formation being formed of a dielectric material other than barium titanate (e.g., the formation at location "D" can be formed of oxide).

Referring to the semiconductor structure 100 as shown in FIG. 6, between first and second metal formations 210, e.g., at location "A" and "B", there can be formed first and second dielectric material formations, e.g., at location "C" and "D", one of the first or second dielectric material formations, e.g., at location "C" being formed of barium titanate, one of the first or second dielectric material formations, e.g., at location "D" being formed of a material other than barium titanate, e.g., oxide.

Figure 7:
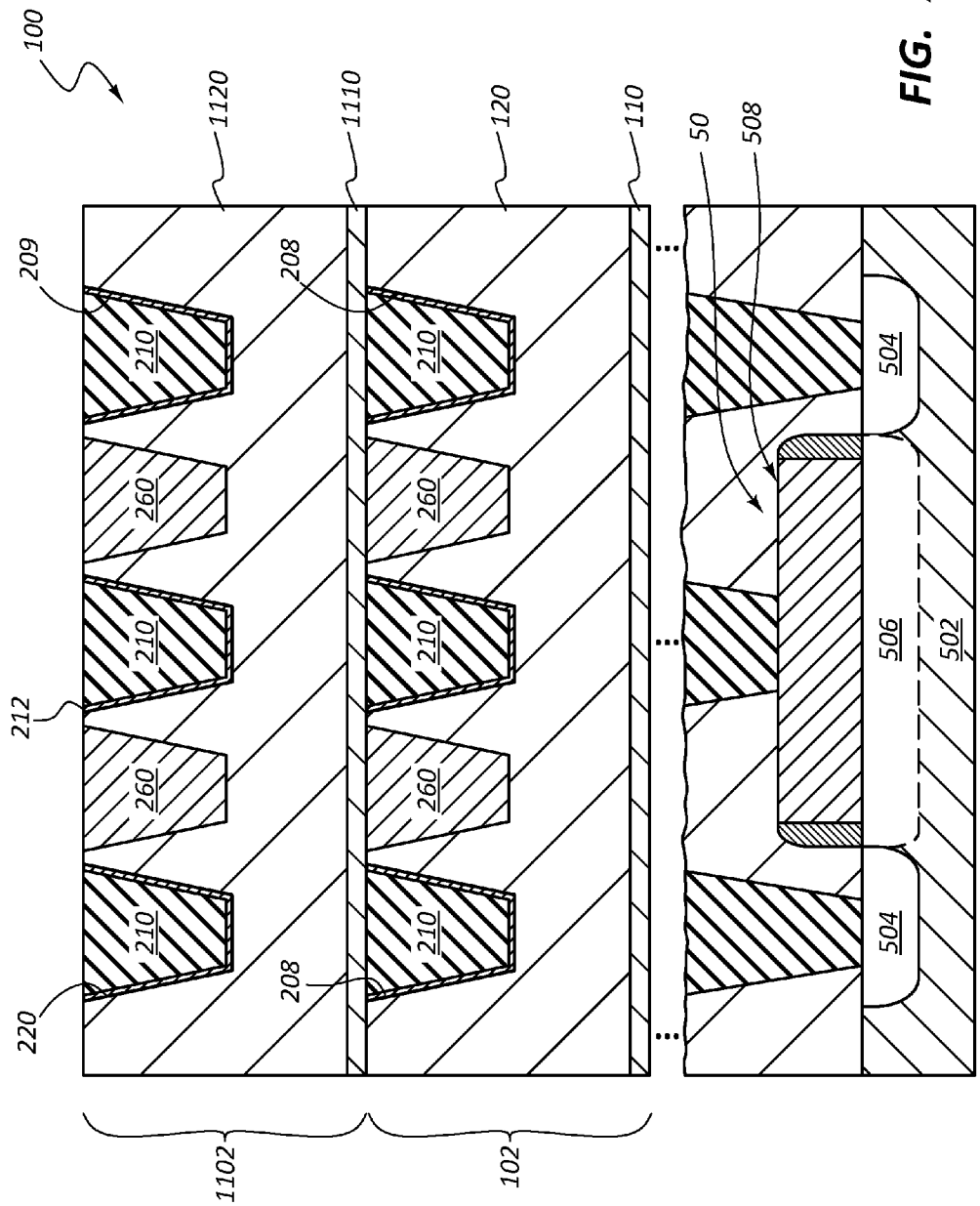
FIG. 7 is a cross sectional side view of a semiconductor structure in an intermediate stage of fabrication after formation of an additional capacitor layer.

FIG. 7 illustrates the semiconductor structure 100 as shown in FIG. 6 after formation of a capacitor layer 1102 having the construction of the capacitor layer 102 Capacitor layer 1102 can be formed by forming layer 1110 on the top of the semiconductor structure 100 of an intermediary fabrication stage as depicted in FIG. 6, and then forming layer 1120 on layer 1110. Layer 1110 can be a dielectric layer, e.g., formed of nitride. The method of FIG. 1 can be performed using layer 1120 as the dielectric layer for completion of capacitor layer 1102.

In one embodiment, layer 102 and layer 1102 which can define capacitor can be fabricated during a Back End Of Line (BEOL) processing stage of semiconductor structure. Prior the formation of layer 102 and layer 1102 during a BEOL processing stage there can be fabricated one or more individual device, e.g., a Field effect transistor (FET) 50 in a Front End Of Line (FEOL) processing stage. FET 50 can be fabricated on a substrate 502 and can have first and second source-drains 504, a channel region 506 and a gate 508.

Figure 8:
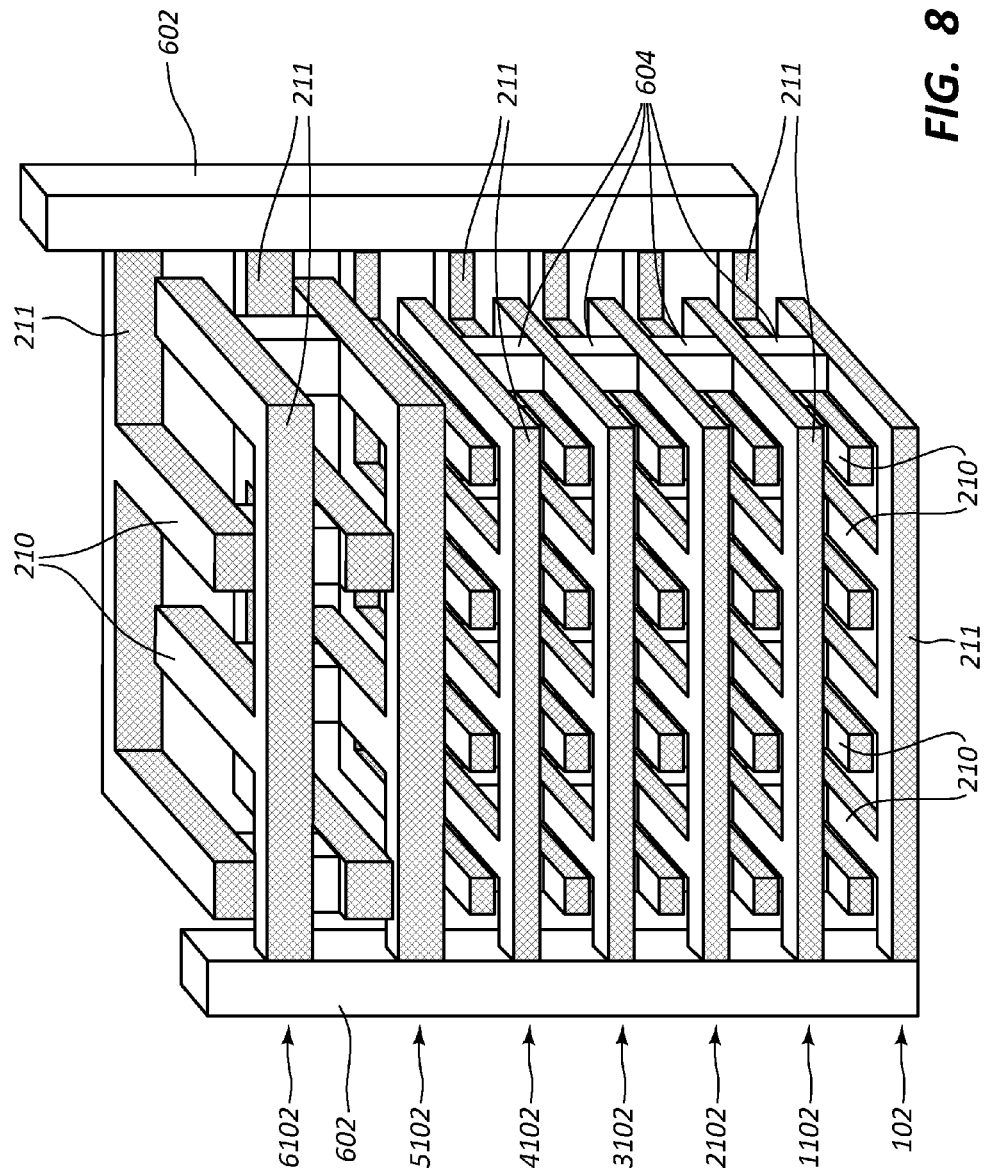
FIG. 8 is a perspective view of a semiconductor structure in an intermediary stage of fabrication wherein first and second metal formations define a Vertical Natural Capacitor (VNCAP).

Referring to FIG. 8, semiconductor structure 100 can be fabricated so that formations 210 define a Vertical Native Capacitor (VNCAP). Semiconductor structure 100 can be fabricated so that layer 102, 1102, and additional capacitor layers are configured as shown in FIG. 8 with posts 602 and vias 604 interconnecting formations 210 of certain of the layers as is depicted in FIG. 8. Further formations 210 can be connected to one another by transverse conductor formations 211 according to the pattern depicted in FIG. 8. Dielectric material formations defined by layer 260 are absent from the view of FIG. 8 for clarity purposes so that the three dimensional structure of formations 210 can be clearly illustrated can be formed intermediate of formations 210 according to the configuration depicted in FIG. 6 and FIG. 7.

There is set forth herein with reference to FIGS. 1-8 in one embodiment, a method including applying a patterned mask, e.g., provided by layer 240 over a semiconductor structure 100, the semiconductor structure 100 having a dielectric layer, e.g., layer 110. There is also set forth herein a method including forming using the patterned mask, e.g., layer 240, a material formation trench, e.g., material formation trench 252, intermediate first and second spaced apart metal formations formed in metal formation trenches of the dielectric layer, e.g., formations 210. There is also set forth herein a method including disposing a dielectric material formation in the material formation trench, e.g., the formation defined by layer 260 within material formation trench 252.

In one embodiment, the applying a patterned mask can include using a photoresist mask, e.g., layer 240 can be a photoresist layer. In one embodiment, the forming a material formation trench, e.g., trench 252 can include includes using a dry etching process, e.g., a plasma etching process.

In one embodiment, the disposing a dielectric material formation can include forming a high k dielectric layer, e.g., layer 260 can be formed of a high k material.

In one embodiment, the disposing a dielectric material formation can include overfilling a high k dielectric layer within a material formation trench 252 and planarizing the high k dielectric layer, optionally with other layers, e.g., layer 236, layer 209 and layer 210. In one embodiment, the dielectric material formation, e.g., which can be defined by layer 260 can be formed of barium titanate or other high k dielectric material.

Referring to FIGS. 7 and 8, method can include completing a first capacitor layer 102, and forming a second capacitor layer 1102 over the first capacitor layer 102. A method can also include, referring to FIG. 8 fabricating the semiconductor structure 100 so that the first and second metal formations define a Vertical Natural Capacitor (VNCAP).

There is set forth herein with reference to FIG. 1-8 in one embodiment a semiconductor structure 100 including a dielectric layer, e.g., layer 120; a first metal formation trench 208 and a second metal formation trench 208; a first metal formation 210 formed in the first metal formation trench 208; a second metal formation 210 formed in the second metal formation trench 208; a material formation trench 252 formed between the first metal formation and the second metal formation; and a dielectric material formation, e.g., a formation defined by layer 260 formed in the material formation trench 252. In one embodiment, the dielectric material formation can be formed of barium titanate. In one embodiment, as described with reference to FIG. 7, the first metal formation 210 and the second metal formation 210 can define a BEOL capacitor. In one embodiment, as illustrated in reference to FIG. 8, the first metal formation 210 and the second metal formation 210 can define a Vertical Natural Capacitor (VNCAP).

Each of the formed layers as set forth herein, e.g., layer 110, layer 120, layer 209, a layer defining formations 210, layer 236, layer 240, layer 260, layer 1110, and/or layer 1120 can be formed by way of deposition using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layers for patterning layer 110, layer 120, layer 209, a layer defining formations 210, layer 236, layer 240, layer 260, layer 1110, and/or layer 1120 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., 110, layer 120, layer 209, a layer defining formations 210, layer 236, layer 240, layer 260, layer 1110, and/or layer 1120 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, forms of the term "define" encompass relationships where an element is partially defined as well as relationships where an element is entirely defined. Furthermore, a device or structure that is configured in a certain way is configured in at least that way, but may also be configured in ways that are not listed. Where a method or apparatus herein is described as having a certain number of elements the method or apparatus can be practiced with fewer than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    applying a patterned mask over a semiconductor structure, the semiconductor structure having a dielectric layer, a first metal formation formed in a first metal formation trench in the dielectric layer, and a second metal formation formed in a second metal formation trench in the dielectric layer and spaced apart from the first metal formation, wherein the patterned mask substantially covers the first metal formation and the second metal formation;
    forming a material formation trench around the patterned mask by etching the dielectric layer, the material formation trench being formed intermediate the first metal formation and the second metal formation; and
    disposing a dielectric material formation in the material formation trench.

2. The method of claim 1, wherein the applying a patterned mask includes using a photoresist mask.

3. The method of claim 1, wherein the forming includes using a dry etching process.

4. The method of claim 1, wherein the forming includes using a plasma etching process.

5. The method of claim 1, wherein the disposing the dielectric material formation includes forming a high k dielectric layer.

6. The method of claim 1, wherein the disposing a dielectric formation includes overfilling a high k dielectric layer and planarizing the high k dielectric layer.

7. The method of claim 1, wherein the dielectric formation is formed of barium titanate.

8. The method of claim 1, wherein the metal formation is formed of copper.

9. The method of claim 1, wherein the method includes completing a first capacitor layer, and forming a second capacitor layer over the first capacitor layer.

10. The method of claim 1, wherein the method includes fabricating the semiconductor structure so that the first metal formation and the second metal formation define a Vertical Natural Capacitor (VNCAP).

11. The method of claim 1, wherein a horizontal cross section extending through the first metal formation and the second metal formation extends through first and second dielectric material formations, one of the first or second dielectric material formations being formed of barium titanate.

12. The method of claim 1, wherein between the first metal formation and the second metal formation there is formed first and second dielectric material formations, one of the first or second dielectric material formations being formed of barium titanate, one of the first or second dielectric material formations being formed of a material other than barium titanate.

* * * * *